United States Patent [19]
Sun et al.

[11] Patent Number: 6,091,537
[45] Date of Patent: Jul. 18, 2000

[54] ELECTRO-ACTUATED MICROLENS ASSEMBLIES

[75] Inventors: Decai Sun, Sunnyvale; Eric Peeters, Fremont; Ross D. Bringans, Cupertino; Patrick Y. Maeda, Mountain View, all of Calif.

[73] Assignee: Xerox Corporation, Stamford, Conn.

[21] Appl. No.: 09/209,347

[22] Filed: Dec. 11, 1998

Related U.S. Application Data

[60] Provisional application No. 60/069,566, Dec. 12, 1997.

[51] Int. Cl.$^7$ ...................................................... G02F 1/03
[52] U.S. Cl. ............................ 359/248; 359/298; 359/619
[58] Field of Search ..................................... 359/248, 619, 359/290, 291, 295, 298

[56] References Cited

U.S. PATENT DOCUMENTS

| | | | |
|---|---|---|---|
| 5,025,346 | 6/1991 | Tang et al. | 361/283 |
| 5,536,988 | 7/1996 | Zhang et al. | 310/309 |
| 5,628,917 | 5/1997 | MacDonald et al. | 216/2 |
| 5,640,133 | 6/1997 | MacDonald et al. | 333/197 |
| 5,719,891 | 2/1998 | Jewell | 372/45 |
| 5,747,366 | 5/1998 | Brillouet et al. | 438/44 |
| 5,764,671 | 6/1998 | Lebby et al. | 372/45 |
| 5,969,848 | 10/1999 | Lee et al. | 359/298 |

FOREIGN PATENT DOCUMENTS 0731417  11/1996  European Pat. Off. .

OTHER PUBLICATIONS

"Fabrication of Submicron High–Aspect–Ratio GaAs Actuators", by Z. Lisa Zhang & Noel C. MacDonald, Journal of Microelectromechanical Systems, vol. 2, No. 3, Jun. 1993, pp. 66–73.

"Laterally Driven Polysilicon Resonant Microstructures", by William C. Tang, Tu–Cuong H. Nguyen and Roger T. Howe, Proceedings IEEE Micro Electro Mechanical Systems, pp. 53–59, Feb., 1989.

"Electrostatic–comb Drive of Lateral Polysilicon Resonators", by William C. Tang, Tu–Cuong H. Nguyen, Michael W. Judy & Roger W. Howe, Transducers '89, Proceedings of the 5$^{th}$ International Conference on Solid–State Sensors and Actuators and Eurosensors III, vol. 2, pp. 328–331, Jun., 1990.

Primary Examiner—Huy Mai

[57] ABSTRACT

A micro-machined movable microlens assembly is formed on undoped or pure a semiconductor substrate. The movable microlens assemblies are to be actuated using force generators which cause various mechanical degrees of freedom depending upon the type of stage suspension and actuation used.

20 Claims, 5 Drawing Sheets

ELECTRO-ACTUATED MICROLENS ASSEMBLIES

This patent application claims priority to Provisional Patent Application, Ser. No. 60/069,566, entitled "Electro-Actuated Scanning Microlens Assemblies" filed on Dec. 12, 1997. The present invention is directed to a scanning microlens integrated on a semiconductor shuttle driven by electrostatic actuators to realize one dimensional linear scanning and focusing adjustment.

U.S. Pat. Nos. 5,536,988, 5,640,133, 5,025,346, "Fabrication of Submicron High-Aspect-Ratio GaAs Actuators" Zhang et al., Journal of Microelectromechanical Systems Vol. 2, No.2, p. 66–73, June 1993, "Laterally Driven Polysilicon Resonant Microstructure" Tang et al., IEEE Micro Electro Mechanical Systems pp. 53–59, February 1989 (reprint), and "Electrostatic-comb Drive of Lateral Polysilicon Resonators" Tang et al., Transducers '89, Proceedings of the 5th International Conference on Solid-State Sensors and Actuators and Eurosensors III, Vol. 2, pp. 328–331, June 1990 (reprint) show the state of the art of microelectromechanical systems (MEMS) actuators and methods of fabricating these devices. U.S. Pat. Nos. 5,747,366 and 5,719,891 show the state of the art of semiconductor light emitting assemblies.

U.S. patent application Ser. No. 08/761,681, entitled "Raster Output Scanner with Pivotal Mirror for Process Direction Light Spot Position Control" filed on Dec. 6, 1996 and assigned to the same assignee as the present invention teaches a MEMS torsional control device.

U.S. patent application Ser. No. 08/940,867, entitled "Highly compact Vertical Cavity Surface Emitting Lasers" filed on Sep. 30, 1997 and assigned to the same assignee as the present invention teaches the formation of highly compact and well-defined VCSELs.

U.S. patent application Ser. No. 09/173,329, entitled "Monolithic Scanning Light Emitting Devices" filed on Oct. 15, 1998 and assigned to the same assignee as the present invention teaches semiconductor light emitters formed on mechanically suspended, moveable light emitter supports. This is accomplished by micromachining semiconductor materials to produce monolithic steerable light emitters.

All of the above references are hereby incorporated by reference.

SUMMARY OF THE INVENTION

The present invention is directed to a scanning microlens integrated on a semiconductor shuttle driven by electrostatic actuators to realize one dimensional linear scanning and focusing adjustment. The scanning microlens can be integrated with a light source, such as a vertical cavity surface emitting laser (VCSEL), a light emitting diode (LED), or an edge emitting laser assembly for beam scanning and focusing adjusting. Applications using the microlens and VCSELs include polygon-less printing and for dynamic scanning correction in polygon ROS. Preferably the scanning microlens is Si-based, which is easier to fabricate than the GaAs-based scanning VCSELs, and can easily be fabricated in large area one-dimensional or two dimensional microlens arrays.

DETAILED DESCRIPTION OF THE INVENTION

Figure 1:
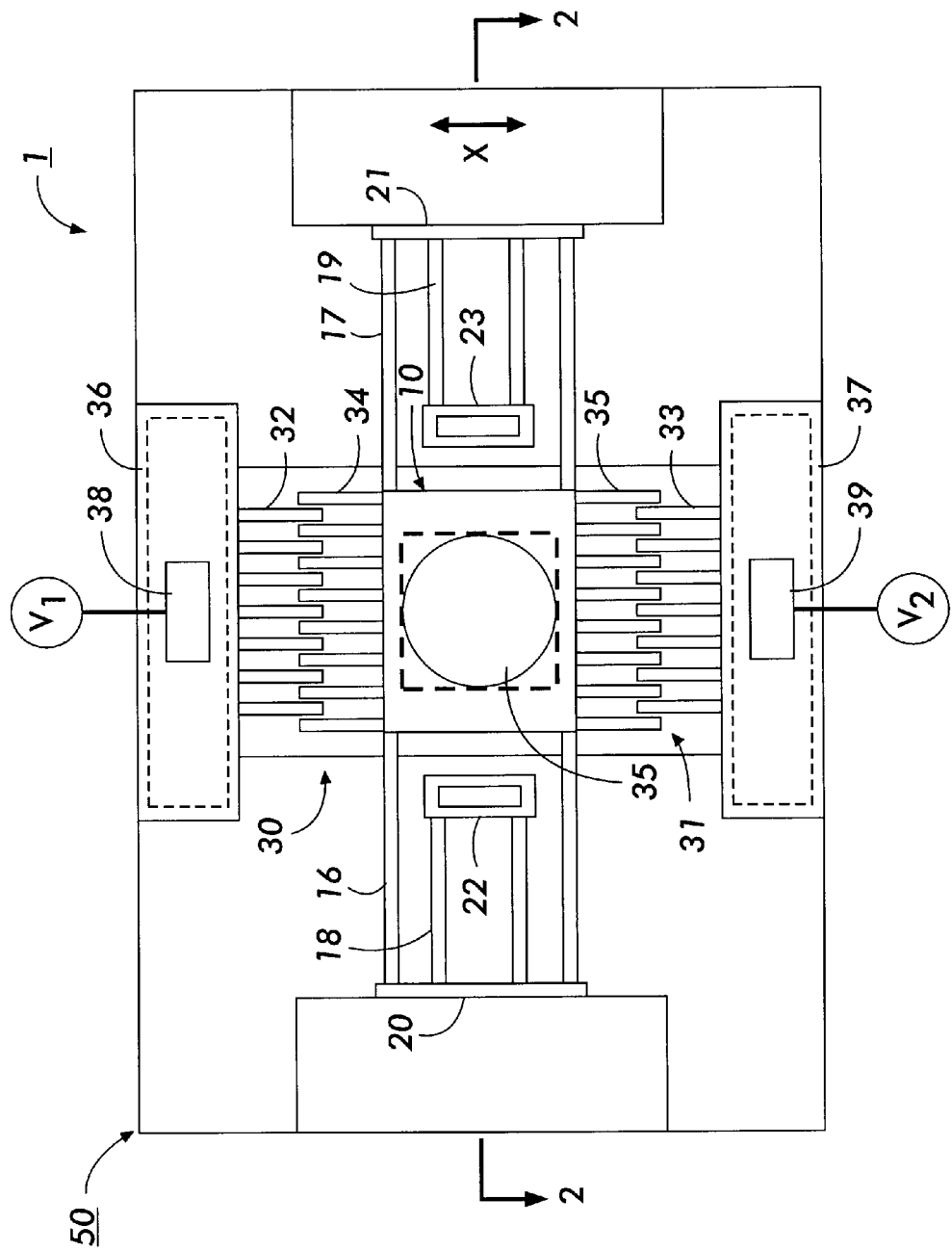
FIG. 1 shows a top view of a microlens assembly movably supported on a semiconductor substrate.

FIG. 1 is a schematic top view of a micromachined movable stage with a microlens, actuation mechanism, suspension system and a fixed light emitter of the present invention. The fixed light emitter may take the form of any light source, for example, vertical cavity surface emitting lasers (VCSELS), light emitting diodes (LEDS), and edge emitting lasers. In the particular embodiment shown in FIG. 1, microlens shuttle 1 has movable microlens stage 10 which supports microlens 12. Microlens stage 10 has one mechanical degree of freedom (x) and is suspended with springs 16–19. Springs 16–19 may take the form of folded bending springs (as shown), and may also include other configurations known from the silicon art, for example, straight beams. Movement of microlens stage 10 is actuated with electrostatic comb drives 30 and 31, all anchored to substrate 50. The electrostatic comb drives may be replaced with any actuation system as is well known in the microelectromechanical systems (MEMS) art.

As shown, microlens stage 10 is moved by applying voltage V1 between static fingers 32 and movable fingers 34 of electrostatic comb 30 and applying a voltage V2 between static fingers 33 and movable fingers 35 of electrostatic comb 31. Electrostatic forces cause movable fingers 34 and 35 of combs 30 and 31 to 'pull in' to minimize the energy stored in the system. Since movable fingers 34 and 35 are attached to the stage with its integrated microlens 12 the electrostatic actuation causes the stage to move to a new position. Folded spring arms 16 and 17 are respectively connected to spring arms 18 and 19 at connecting beams 20 and 21 and are anchored to substrate 50 at anchor points 22 and 23. Static combs 32 and 33 are anchored to substrate 50 at comb spines 36 and 37. In a first order system, the stage position is proportional to the force, which is proportional to the square of the applied voltage.

The in-plane shape of structures (stage, springs, combs) is arbitrary within fairly wide limits. Mechanical designs such as straight beam suspensions, tapered or stepped comb fingers, x/y folded spring suspensions, torsional springs, archimedian spiral springs for a rotational degree of freedom, etc., which are well-known in silicon structures, may be implemented in the silicon.

Following the direction of the electrostatic force generated by either electrostatic comb drives 30 or 31, folded beams 16–19 deflect and microlens stage 10 moves away from the neutral position. The scan resonant frequency of the microlens stage is on the order of kilohertz or more depending on the thickness of the mass of the microlens stage 10 and the spring constant of the folded beam.

Figure 2:
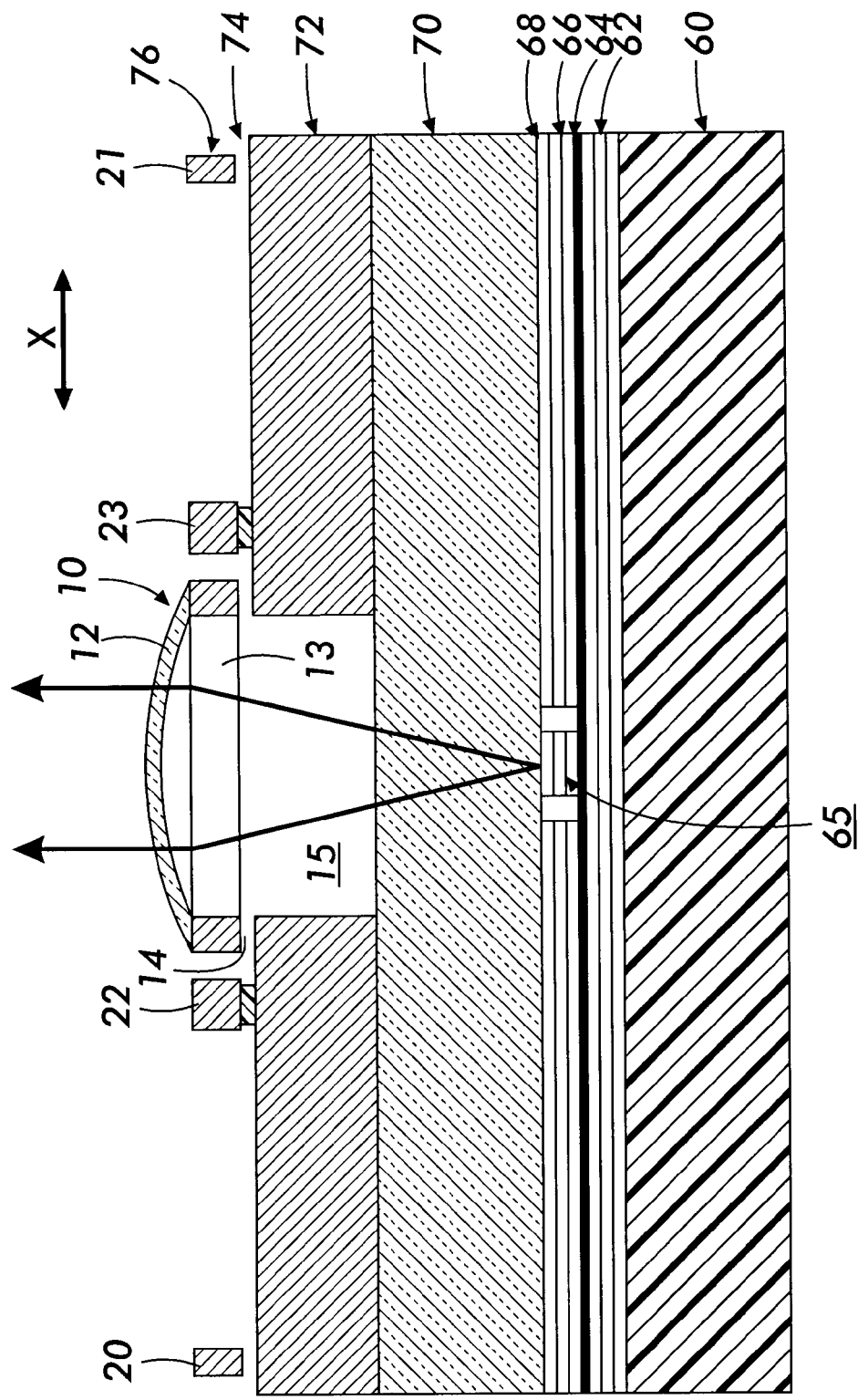
FIG. 2 shows a cross-sectional view of the microlens assembly in FIG. 1 along line 2—2.

FIG. 2 is a cross-sectional view of FIG. 1 with the scanning shuttle integrated with a VCSEL 65. The VCSEL is at the focal point of the microlens . 2 so that the optical beam passing through the lens is collimated. Moving the lens laterally relative to the VCSEL bends the light beam and sweeps the far field spot of the light beam (see FIGS. 4 and 5).

The VCSEL structure includes layers of a III–V substrate 60, N quarter wave distributed Bragg reflector (DBR) mirror layers 62, active region 64, P DBR mirror 66 and P+ contact layer 68. The VCSEL structure may be formed using well-known processes. A spacer layer 70 is formed between the VCSEL structure and the microlens shuttle 10. The spacer layer may be polyimide, which is coated on the VCSEL surface by conventional coating techniques, for example, spin coated. The spacer layer should be insulative and light transmitting. The function of the spacer is to adjust the distance between the microlens and the VCSEL. The thickness of the spacer varies depending on the focal point of microlens 12 and the thickness of substrate 50. The microlens shutter might be fabricated from a (SOI) (Si/SiO$_2$/Si) wafer having Si layer 72, SiO$_2$ layer 74 and Si layer 76.

One approach to fabricate microlens 12 is by melting a photoresist pedestal deposited on top of the SiO$_2$ layer 74. Through melting and reflow, the photoresist pedestal changes to a spherical shape due to the surface tension [Z. Popovic, R. Sprague, and G. A. N. Connell, "Technique for monolithic fabrication of microlens arrays", Applied Optics, Vol. 27, pp. 1281–1284 (1988), hereby incorporated by reference]. This technique has been well adopted for fabrication of large arrays of microlenses. For post-processing protection, a layer of SiO$_2$ can be deposited on top of the photoresist lens (not shown). For a 7 µm high and 100 µm diameter spherical-shape lens, the radius of the sphere is calculated to be 180 µm. Assuming that the refractive index of the photoresist is 1.6, the focal point of the concave lens is 300 µm.

Another approach to fabricate the microlens is by bonding a SiO$_2$ and a SOI wafer together, then polishing the SiO$_2$ wafer down to 8 µm thick. After reflowing the photoresist microlens pattern, the pattern is transferred onto the SiO$_2$ layer by dry etching. The fabrication may start with the substrate etch to form cavity 15 using a wet chemical etching solution such as KOH. The etch would stop at the SiO$_2$ etch stop layer. Then a circular hole is formed from the top by etching away the Si in region 13 by dry or wet chemical etching. After this, a photoresist microlens is formed over the region 13 by photolithography and resist reflow. The last step is the etching of comb drive structure and the stage.

Figure 3:
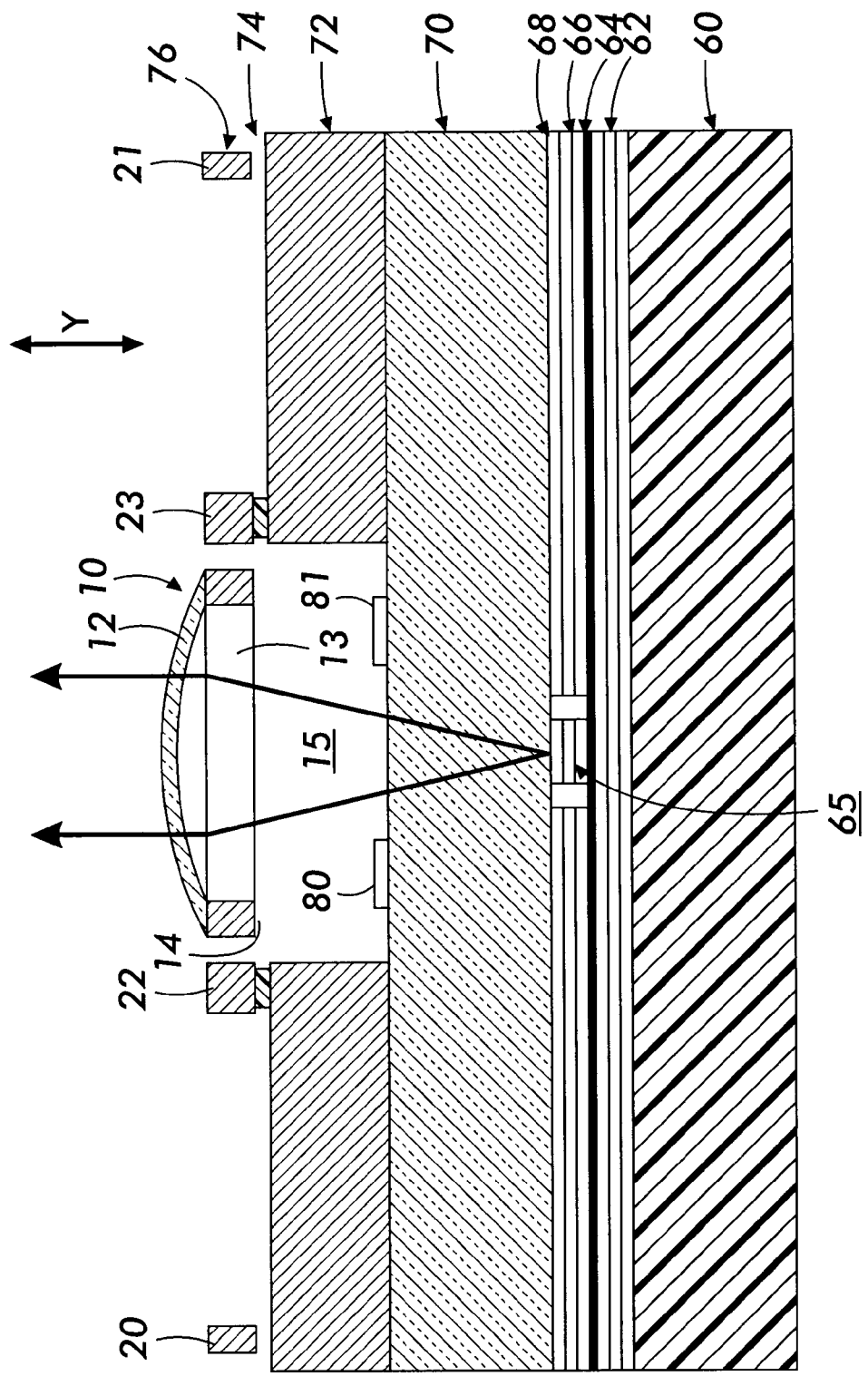
FIG. 3 shows a cross-sectional view of another embodiment of the microlens assembly.

In some applications, not only linear scanning but also focus adjustment is needed. FIG. 3 depicts the schematic of the scanning plus focusing microlens Si shuttle. The focusing can be realized by moving the microlens 12 up and down (y-direction) relative to the light source 65. The microlens stage 10 can be pulled toward the VCSEL 65 by electrostatic force between electrodes 80 and 81 on the spacer substrate 70 and the Si frame forming space 15 below the microlens. Electrodes 80 and 81 may be, for example, indium tin oxide (ITO) electrodes. To guarantee a large focus adjustment, the fingers need to be thick enough to maintain a large force between the fingers of the movable and the stationary comb drives in a pull-down position. For example, with 50 µm thick fingers, the resonance frequency and the dynamic scanning range in the linear direction do not change at all, which is desirable. Preferably the gap between the electrode and the microlens platform is around 10 µm to make the electrostatic force large enough to pull the platform downward. So the Si substrate has to be thinned or the ITO electrode needs to sit on top of a mesa to reduce the gap.

Figure 4:
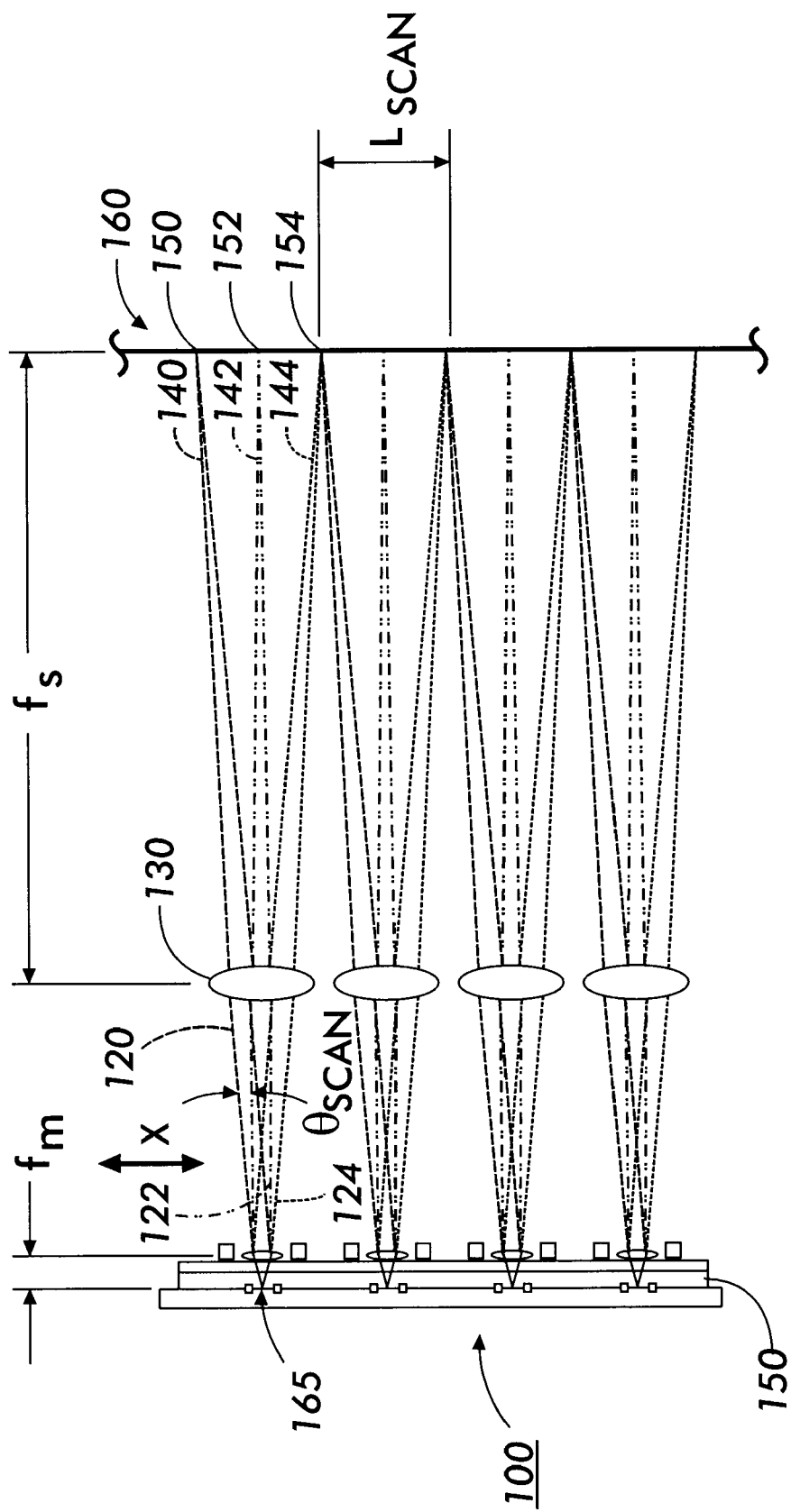
FIG. 4 shows a side view of a microlens assembly array using a plurality of the microlens assemblies with a secondary lens for each microlens assembly.

FIG. 4 shows an optical imaging system for polygon-less printing using a secondary focusing microlens array and a scanning microlens/VCSEL array described above. A secondary microlens array focuses the collimated light from the scanning microlens/VCSEL array onto imaging plane 150. An array 100 of VCSELs 165 and scanning microlenses 112 are formed on substrates having layers and actuators as described with respect to FIGS. 2 and 3. Only the scanning aspect of the microlens array is shown in FIG. 4. Each microlens 112 moves back and forth in the x direction. As the electrostatic comb actuators (not shown) are actuated, each microlens 112 is moved from a first position forming light rays 120, to a second position forming light rays 122, and to a third position forming light rays 124, all of these rays being further focused by secondary lens array 130. The secondary lens array can be fabricated on a glass substrate to decrease the requirement of its alignment with the light sources. This way, the secondary lenses do not have to be mounted and aligned individually, but instead, can be aligned as a single group or array. Secondary lens 120 redirects the light to form light rays 140,142 and 144 which intersect the imaging plane 160 at points 150, 152 and 154. In the case of xerography, imaging plane 150 is a conductive surface or photoreceptor. In one example with a printing resolution of 1200 dpi, the first order optical system parameters are:

$f_m$=300 µm, focal length of microlens;

$f_s$=1.9875 mm, focal length of lens in array;

$x_{scan}$=±25.0 µm, distance microlens is moved to produce a scanning beam;

$\theta_{scan}$=$x_{scan}/f_m$=±0.083333 radians, angle of scanning beam produced by scanning microlens;

FWHM$_{VCSEL}$≈3.2 µm, full width at half the maximum intensity of the beam at the VCSEL;

FWHM$_{IP}$≈21.2 µm, full width at half the maximum intensity of the beam at the imaging plane;

m=FWHM$_{IP}$/FWHM$_{VCSEL}$=$f_s/f_m$=6.625, VCSEL to imaging plane magnification; and $L_{scan}$=2 $f_s$ |$\theta_{scan}$|=331.25 µm, length of scan produced by a single VCSEL at the imaging plane.

For 8 inch page width printing, an array of 570 microlens is needed.

Figure 5:
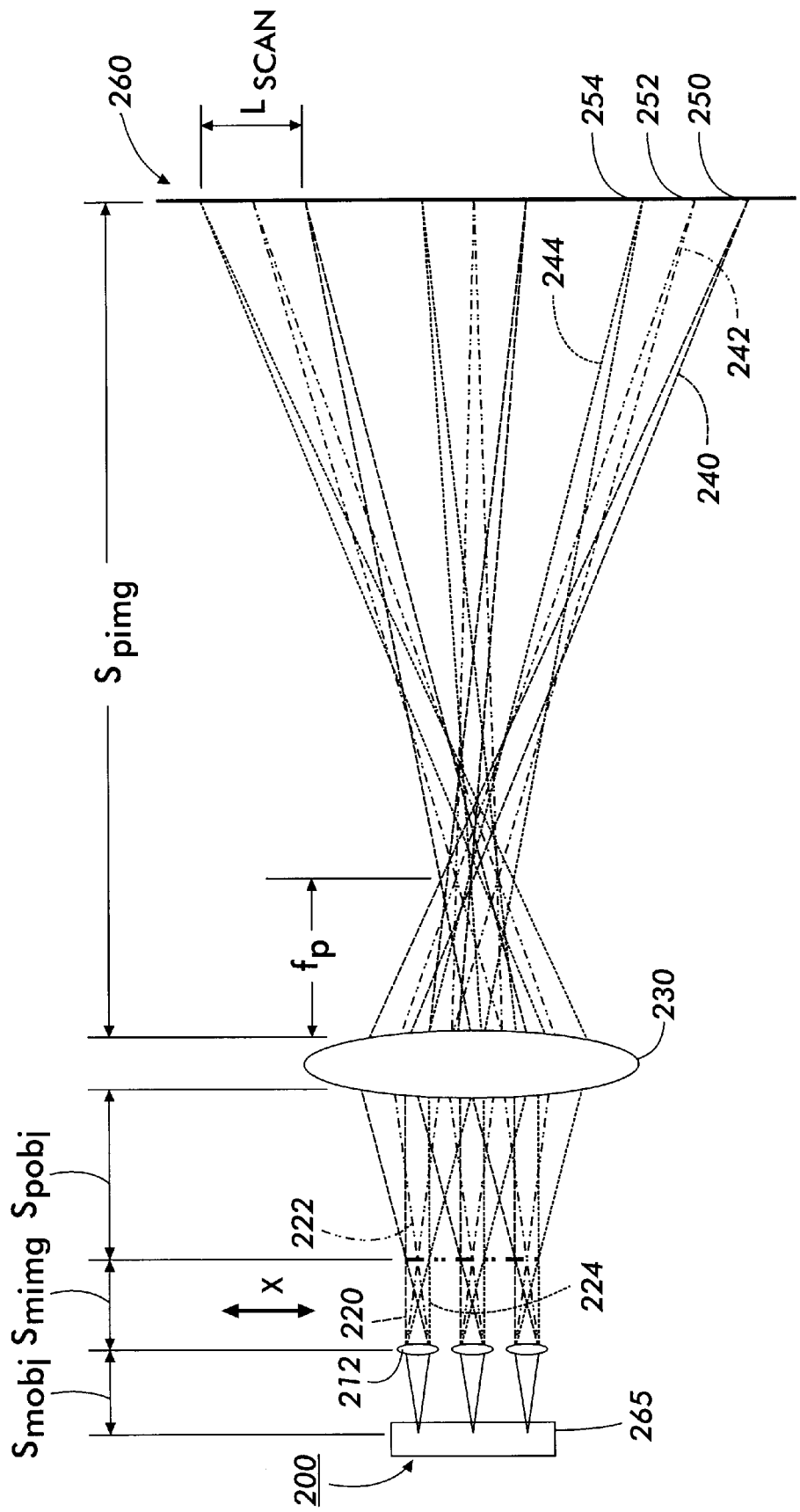
FIG. 5 shows a side view of a microlens assembly array using a plurality of the microlens assemblies with a single projection lens.

FIG. 5 shows a polygon-less printing configuration using one large projection lens 230. The projection lens focuses the collimated light from the scanning microlens/VCSEL array onto imaging plane 260. An array 200 of VCSELs 265 and scanning microlenses 212 are formed on substrate 250 having layers and actuators as described with respect to FIGS. 2 and 3. Only the scanning aspect of the microlens array is shown in FIG. 5. Each microlens 212 moves back and forth in the x direction. As the electrostatic comb actuators (not shown) are actuated, each microlens 212 is moved from a first position forming light rays 220, to a second position forming light rays 222, and to a third position forming light rays 224, all of these rays being further focused by secondary projection lens 230. Projection lens 230 redirects the light to form light rays 240, 242 and 244 which intersect the imaging plane 260 at points 250, 252 and 254. In the case of xerography, imaging plane 260 is a conductive surface or photoreceptor. In another example with a printing resolution of 1200 dpi, the first order optical system parameters are:

$f_m$=300 µm, focal length of microlens;

$m_m$=1, VCSEL to projection lens object plane magnification;

$m_p$=6.625, projection lens object plane to imaging plane magnification;

$x_{scan}$=±12.5 µm, distance microlens is moved in x direction to produce a scanning beam;

FWHM$_{VCSEL}$≈3.2 µm, full width at half the maximum intensity of the beam at the VCSEL;

FWHM$_{IP}$≈21.2 µm, full width at half the maximum intensity of the beam at the imaging plane;

m=FWHM$_{IP}$/FWHM$_{VSCEL}$=$m_m$ $m_p$=6.625, VCSEL to imaging plane magnification;

$s_{mobj}$=$f_m$ (m+1)/m=600 µm, distance between microlens object plane and microlens;

$s_{mimg}$=$m_m$ $s_{mobj}$=600 µm, distance between microlens and microlens image plane;

$s_{pobj}$=100 mm, distance between projection lens object plane and first principle plane of the projection lens;

$s_{pimg} = m_p \, s_{pobj} = 662.5$ mm, distance between projection lens object plane and the second principle plane of the projection lens $f_p = (s_{pobj} \, m_p)/(m_p+1)$, focal length of projection lens; and $L_{scan} = 2 \, (m_m+1) \, m_p \, |x_{scan}| = 331.25$ μm, length of scan produced by a single VCSEL at the imaging plane.

Since the spacing between the microlenses is only 50 μm, it is too small for the array to be arranged linearly. Due to the space constraints, the microlens array needs to be staggered two-dimensionally.

There are many uses for the microlens assemblies. For example, if the microlenses are used in a polygon ROS, they can be used to do dynamic focusing to correct for manufacturing errors or field curvature, and sub-pixel scanning in the cross scanning direction.

As those skilled in the art will appreciate, other various modifications, extensions, and changes to the foregoing disclosed embodiments of the present invention are contemplated to be within the scope and spirit of the invention as defined in the following claims.

We claim:

1. A micro-machined microlens assembly, comprising:
   a substrate made of semiconductor material;
   a microlens;
   a microlens support which movably supports the microlens;
   at least one suspension member, the at least one suspension member having a first end and a second end, the first end being attached to the microlens support and the second end being attached to the substrate thereby suspending the microlens support above the substrate; and
   at least one force generator which moves the microlens support.

2. The micro-machined microlens assembly as claimed in claim 1, wherein the microlens support is made of a semiconductor material.

3. The micro-machined microlens assembly as claimed in claim 1, wherein the at least one suspension member is made of a semiconductor material.

4. The micro-machined microlens assembly as claimed in claim 1, wherein the at least one force generator is made of semiconductor material.

5. The micro-machined microlens assembly as claimed in claim 1, wherein the at least one suspension member includes two suspension members attached to opposite sides of the substrate.

6. The micro-machined microlens assembly as claimed in claim 1, further comprising a light source supported on the substrate.

7. The micro-machined microlens assembly as claimed in claim 1, wherein the at least one force generator causes the microlens support to move horizontally parallel to the substrate.

8. The micro-machined microlens assembly as claimed in claim 7, wherein the at least one force generator is a pair of electrostatic comb sets each electrostatic comb set having a fixed comb attached to the substrate and a movable comb attached to the microlens support.

9. The micro-machined microlens assembly as claimed in claim 1, wherein the at least one force generator causes the microlens support to move perpendicular to the substrate.

10. The micro-machined microlens assembly as claimed in claim 9, wherein the at least one force generator is a pair of electrodes fixed to the substrate beneath the microlens support.

11. An array of micro-machined microlens assemblies, comprising:
    a substrate made of semiconductor material;
    a plurality of microlenses;
    at least one microlens support which movably supports the microlenses;
    a plurality of suspension members, each suspension member having a first end and a second end, the first end of each suspension member being attached to the microlens support and the second end of each suspension member being attached to the substrate thereby suspending the at least one microlens support above the substrate; and
    at least one force generator which moves the plurality of microlenses with respect to the substrate.

12. The array of micro-machined microlens assemblies as claimed in claim 11, further comprising a plurality of light sources, a light source being associated with each microlens, light rays from each light source passing through the microlens associated with each light source.

13. The array of micro-machined microlens assemblies as claimed in claim 11, wherein each microlens is supported by a separate microlens support.

14. The array of micro-machined microlens assemblies as claimed in claim 12, further comprising a secondary lens, wherein light rays from a single microlens pass through the secondary lens.

15. The array of micro-machined microlens assemblies as claimed in claim 12, further comprising a secondary lens, wherein light rays from more than one microlens pass through the secondary lens.

16. A method of moving a micro-machined microlens assembly, comprising:
    suspending a microlens assembly on a semiconductor substrate, the microlens assembly being supported on a microlens support; and
    actuating a first force generator which moves the microlens support in a first direction; and
    actuating a second force generator which moves the microlens support in a second direction.

17. The method of moving a micro-machined movable microlens assembly as claimed in claim 16, further comprising:
    actuating a second force generator which moves the microlens support in a second direction, wherein the first and second direction are substantially parallel to the substrate.

18. The method of moving a micro-machined movable microlens assembly as claimed in claim 17, wherein actuating a first force generator includes applying a first voltage to a first set of electric comb actuators which moves the microlens support in the first direction and actuating a second force generator includes applying a second voltage to a second set of electric comb actuators.

19. The method of moving a micro-machined movable microlens assembly as claimed in claim 16, further comprising:
    actuating the first force generator which moves the microlens support in a second direction, wherein the first and second directions are substantially perpendicular to the substrate.

20. The method of moving a micro-machined movable microlens assembly as claimed in claim 19, wherein actuating a first force generator includes applying a first voltage to a pair of electrodes actuator which moves the microlens support in the first direction.

* * * * *